(12) United States Patent
Fujino

(10) Patent No.: US 10,170,347 B2
(45) Date of Patent: Jan. 1, 2019

(54) SUBSTRATE PROCESSING SYSTEM

(71) Applicant: TOKYO ELECTRON LIMITED, Tokyo (JP)

(72) Inventor: Yutaka Fujino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/128,804

(22) PCT Filed: Feb. 27, 2015

(86) PCT No.: PCT/JP2015/055818
§ 371 (c)(1),
(2) Date: Sep. 23, 2016

(87) PCT Pub. No.: WO2015/151676
PCT Pub. Date: Oct. 8, 2015

(65) Prior Publication Data
US 2017/0110349 A1    Apr. 20, 2017

(30) Foreign Application Priority Data
Mar. 31, 2014  (JP) .................. 2014-073450

(51) Int. Cl.
*H01L 21/67*   (2006.01)
*C23C 16/44*   (2006.01)
(Continued)

(52) U.S. Cl.
CPC .... *H01L 21/67144* (2013.01); *C23C 16/4412* (2013.01); *C23C 16/45546* (2013.01);
(Continued)

(58) Field of Classification Search
CPC ........... H01L 21/67167; H01L 21/6719; H01L 21/67196; H01L 21/67201; H01L 21/677;
(Continued)

(56) References Cited

U.S. PATENT DOCUMENTS 4,785,962 A * 11/1988 Toshima .................. F16K 1/16
                                                  204/298.25
4,886,592 A    12/1989 Anderle et al.
(Continued)

FOREIGN PATENT DOCUMENTS

JP      1-142081 A       6/1989
JP      2010-245449 A    10/2010
KR      1020130132938 A  12/2013

OTHER PUBLICATIONS

International Search Report dated May 26, 2015 issued in International Application No. PCT/JP2015/055818.

*Primary Examiner* — Tyrone V Hall, Jr.
(74) *Attorney, Agent, or Firm* — Nath, Goldberg & Meyer; Jerald L. Meyer

(57) ABSTRACT

A substrate processing system for performing a process with respect to a plurality of substrates includes an annular process chamber configured to accommodate the plurality of substrates and to perform a predetermined process on the plurality of substrates, a cassette mounting part configured to mount a cassette which accommodates the plurality of substrates, and a substrate transfer mechanism configured to transfer the plurality of substrates between the annular process chamber and the cassette mounting part. The plurality of substrates is concentrically disposed within the annular process chamber in a plane view.

6 Claims, 8 Drawing Sheets

(51) Int. Cl.
*C23C 16/455* (2006.01)
*C23C 16/54* (2006.01)
*H01L 21/52* (2006.01)
*H01L 21/677* (2006.01)
*H01L 21/683* (2006.01)
*H01L 21/687* (2006.01)

(52) U.S. Cl.
CPC .............. *C23C 16/54* (2013.01); *H01L 21/52* (2013.01); *H01L 21/6719* (2013.01); *H01L 21/6773* (2013.01); *H01L 21/67161* (2013.01); *H01L 21/67167* (2013.01); *H01L 21/67196* (2013.01); *H01L 21/67742* (2013.01); *H01L 21/6838* (2013.01); *H01L 21/68764* (2013.01)

(58) Field of Classification Search
CPC ........... H01L 21/67703; H01L 21/6773; H01L 21/67739; H01L 21/67742
See application file for complete search history.

(56) References Cited

U.S. PATENT DOCUMENTS

| | | | | |
|---|---|---|---|---|
| 5,248,886 A | * | 9/1993 | Asakawa | C30B 35/005 250/442.11 |
| 5,838,121 A | * | 11/1998 | Fairbairn | H01L 21/67742 318/45 |
| 5,951,770 A | * | 9/1999 | Perlov | H01L 21/67126 118/719 |
| 6,007,675 A | * | 12/1999 | Toshima | C23C 16/54 118/716 |
| 6,071,055 A | * | 6/2000 | Tepman | H01L 21/67161 414/217 |
| 6,629,539 B1 | * | 10/2003 | Yanagita | H01L 21/67196 134/134 |
| 7,695,233 B2 | * | 4/2010 | Toshima | H01L 21/67201 156/345.23 |
| 2002/0020355 A1 | * | 2/2002 | Saeki | H01L 21/67167 118/719 |

* cited by examiner

SUBSTRATE PROCESSING SYSTEM

CROSS-REFERENCE TO RELATED APPLICATION

This application is based upon and claims the benefit of priority from Japanese Patent Application No. 2014-073450, filed on Mar. 31, 2014, the entire contents of which are incorporated herein by reference.

TECHNICAL FIELD

The present disclosure relates to a substrate processing system for performing a predetermined process with respect to a plurality of substrates.

BACKGROUND

For example, in a manufacturing process of a semiconductor device or the like, various kinds of processes such as an ion implantation process, an etching process, a film-forming process and the like are performed with respect to semiconductor wafers (hereinafter referred to as "wafers" as substrates. A process called an atomic layer deposition (ALD) or a molecular layer deposition (MLD), which performs a film-forming process with respect to wafers, is implemented by, for example, a batch processing system which performs a process with respect to a plurality of wafers within an evacuated process chamber.

As the batch processing system, there has been used a system disclosed in, for example, Patent Document 1. For example, as illustrated in FIG. 13, the batch processing system 200 includes, for example, a circular mounting table 210 configured to concentrically mount a plurality of wafers W thereon in order to assure the improvement of in-plane uniformity in a process of the wafers W and the improvement of uniformity in the process between the wafers W and a cylindrical process chamber 211 configured to accommodate the mounting table 210, A vacuum transfer chamber 212 is installed adjacent to the process chamber 211. The wafers W accommodated within a cassette C of a cassette station 201 disposed at the atmospheric side a e transferred into the process chamber 211 through a load lock chamber 214 adjoining the vacuum transfer chamber 212, by a transfer arm 213 disposed at the atmospheric side and a transfer arm 215 installed in e vacuum transfer chamber 212.

PRIOR ART DOCUMENTS

Patent Documents

Patent Document 1: Japanese laid-open publication No. 2010-245449

In the mounting table 210 on which the wafers W are concentrically mounted, as indicated by a broken line within the process chamber 211 in FIG. 13, a space A not mounted with the waters W is generated at the center of the mounting table 210. The space A gradually increases as the number of the wafers W mounted on the mounting table 10, namely the number of the wafers W accommodated within the process chamber 211, grows larger. Thus, in the process chamber 211 illustrated in FIG. 13 and which is configured to process the concentrically-mounted wafers W, the volume of the process chamber 211 required in processing one sheet of the wafer W (hereinafter referred to as a "required processing volume") increases as the number of the wafers W to be processed becomes larger. Consequently, the volume of a space to be exhausted in order to process one sheet of the wafer W increases and, therefore, the time required in exhausting the interior of the process chamber 211 to a predetermined vacuum degree increases. As a result, there is posed a problem in that throughput of the wafer process is reduced.

For that reason, the number of the wafers W to be processed in the process chamber 211 is usually set at six so that the volume of the process chamber 211 per one wafer W should not become excessively large. A plurality of process chambers 211 configured in this way is installed adjacent to the vacuum transfer chamber 212.

However, if the plurality of process chambers 211 is installed around the vacuum transfer chamber 212, the vacuum transfer chamber 212 becomes larger, This poses a problem in that the footprint of the batch processing system 200 as a whole increases.

SUMMARY

Some embodiments of the present disclosure provide a substrate processing system for performing a predetermined process with respect to a plurality of substrates, which is capable of minimizing an increase in the volume of a process chamber attributable to an increase in the number of wafers W to be processed in the process chamber.

According to one embodiment of the present disclosure, there is provided a substrate processing system for performing a process with respect to a plurality of substrates, including: an annular process chamber configured to accommodate the plurality of substrates and to perform a predetermined process on the plurality of substrates; a cassette mounting part configured to mount a cassette which accommodates the plurality of substrates; and a substrate transfer mechanism configured to transfer the plurality of substrates between the annular process chamber and the cassette mounting part, wherein the plurality of substrates is concentrically disposed within the annular process chamber in a plane view.

According to the present disclosure, the annular process chamber is formed in an annular shape and the plurality of substrates is concentrically disposed within the annular process chamber. Thus, the above-described space that gradually increases along with the increase in the number of the accommodated substrates in the conventional cylindrical process chamber is not generated. Accordingly, even when the number of the substrates to be processed in the annular process chamber is increased, it is possible to suppress the increase in the volume of the process chamber to a minimum level.

According to the present disclosure, it is possible to provide a substrate processing system for performing a predetermined process with respect to a plurality of substrates, which is capable of minimizing an increase in the volume of an annular process chamber attributable to an increase in the number of wafers to be processed in the annular process chamber.

DETAILED DESCRIPTION

Figure 1:
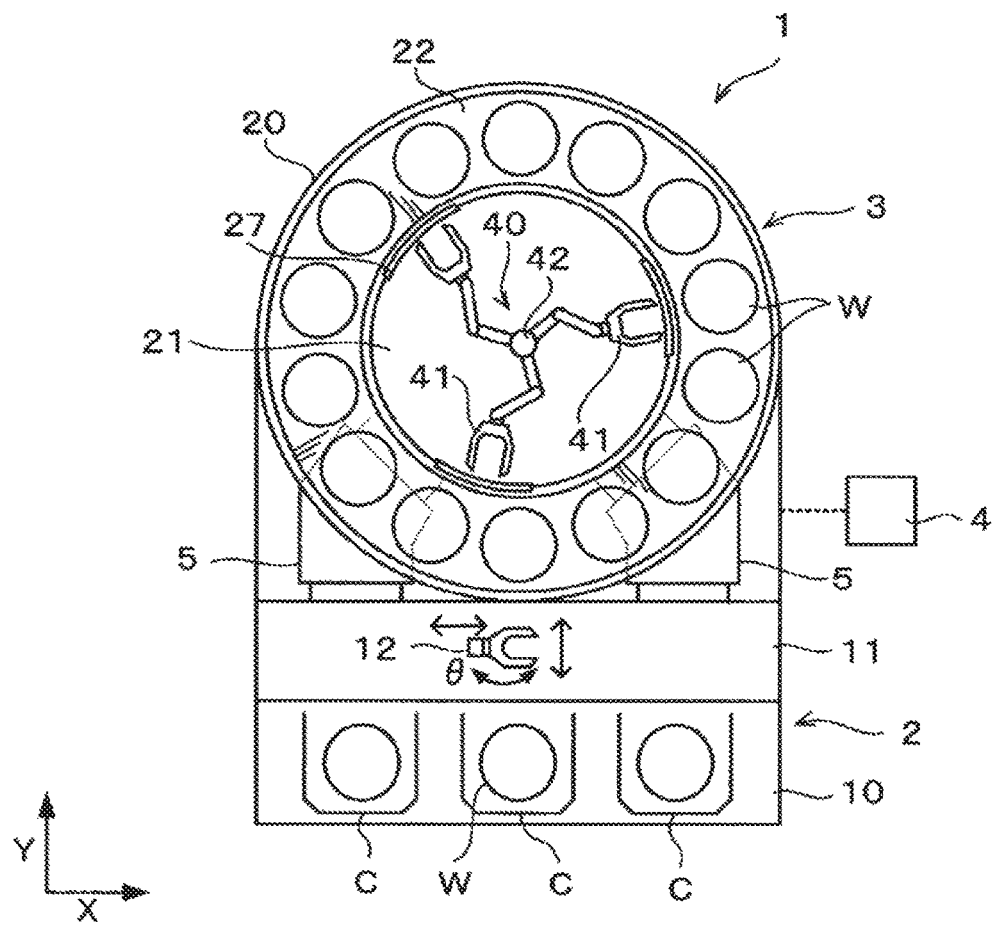
FIG. 1 is a plane view illustrating a schematic configuration of a wafer processing system according to one embodiment.
Figure 2:
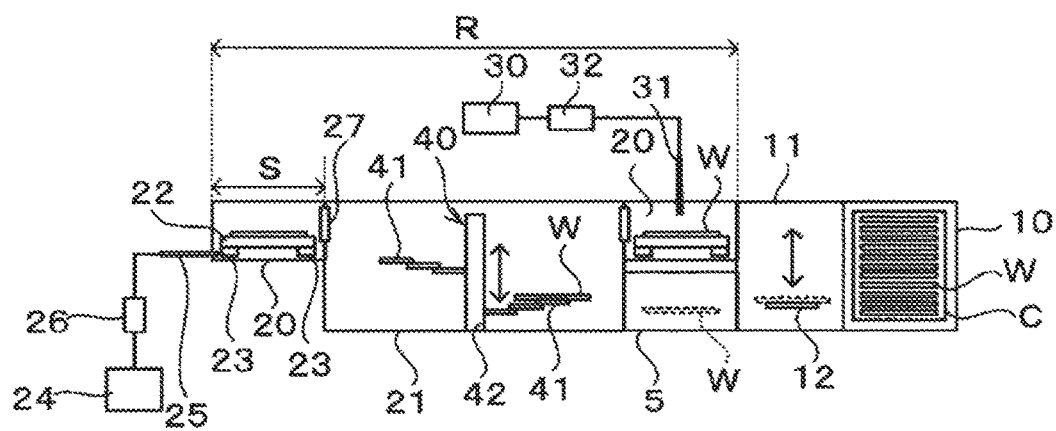
FIG. 2 is a vertical sectional view illustrating the schematic configuration of the wafer processing system according to one embodiment.

Embodiments of the present disclosure will now be described. In the subject specification and the drawings, components having substantially identical functions and configurations will be designated by like reference numerals with the duplicate descriptions thereof omitted. FIG. 1 is a plane view illustrating a schematic configuration of a wafer processing system 1 used as a substrate processing system according to one embodiment. FIG. 2 is a vertical sectional view illustrating the schematic configuration of the wafer processing system 1 according to one embodiment. Descriptions will be made by taking, as an example, a case where, for example, semiconductor wafers are used as the wafers W of this embodiment and where so-called ALD for performing a film-forming process with respect to the wafers is implemented in the wafer processing system 1.

As illustrated in FIG. 1, the wafer processing system 1 includes a cassette station 2 configured to load and unload a plurality of wafers W on a cassette-by-cassette basis, a processing station 3 configured to process the wafers W in, for example, a batch manner, and a control device 4 configured to control the process of the wafers W performed in the processing station 3. The cassette station 2 and the processing station 3 are integrally connected to each other via load lock chambers 5.

The cassette station 2 includes a cassette mounting part 10 and a transfer chamber 11 installed adjacent to the cassette mounting part 10. A plurality of, e.g., three, cassettes C, each of which is capable of accommodating the plurality of wafers W, may be arranged on the cassette mounting part 10 in an X direction (in a left-right direction in FIG. 1). A wafer transfer arm 12 is installed in the transfer chamber 11. The wafer transfer arm 12 is movable in an up-down direction and a left-right direction and is rotatable about a vertical axis (in θ direction). The wafer transfer arm 12 is configured to transfer the wafers W between the cassettes C of the cassette mounting part 10 and the load lock chambers 5. In FIG. 1, there is illustrated a state in which one wafer transfer arm 12 is disposed in the transfer chamber 11. However, the arrangement and installation number of the wafer transfer arm 12 are not limited to those of this embodiment but may be arbitrarily set.

The processing station 3 includes a substantially annul process chamber 20 configured to process the plurality of wafers W in a batch manner, and a vacuum transfer chamber 21 installed adjacent to the process chamber 20 in an internal space surrounded by the process chamber 20. For example, as illustrated in FIG. 2, the width S of a cross section of the process chamber 20 is set larger than the diameter of the wafer W so that the process chamber 20 can horizontally accommodate the wafers W. A mounting table 22 on which the plurality of wafers W is mounted, is installed within the process chamber 20. In FIG. 2, the cross section of the process chamber 20 is shown in a rectangular shape. However, the shape of the cross-section of the process chamber 20 is not limited to that of this embodiment but may be arbitrarily set as long as the annular mounting table 22 can be disposed within the process chamber 20.

For example, as illustrated in FIG. 1, similar to the process chamber 20, the mounting table 22 is formed in an annular shape and is disposed in a concentric relationship with the process chamber 20. In the mounting table 22, the plurality of wafers W is arranged on the same circumference along the circumferential direction of the mounting table 22. In FIG. 1, there is illustrated astute in which, for example, fourteen wafers W are mounted on the mounting table 22. However, the number of the wafers W and the size of the mounting table 22 may he arbitrarily set.

A drive mechanism 23 configured to horizontally rotate the mounting table 22 about the center axis of the mounting table 22 is installed, for example, on a lower surface of the mounting table 22. The drive mechanism 23 is formed of, for example, a rotatable roller and the like. Lift pins (not shown) are embedded in the mounting table 22 so that the wafers W can be delivered between the lift pins and a wafer transfer mechanism 40 which will he described later.

Figure 3:
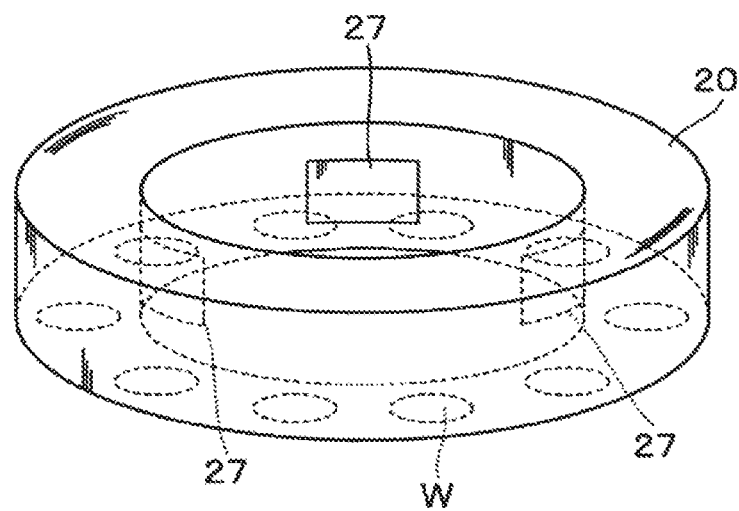
FIG. 3 is an explanatory view illustrating a schematic configuration of a process chamber.

For example, as illustrated in FIG. 2, an exhaust mechanism 24 is coupled to the process chamber 20 via an exhaust pipe 25 so that the interior of the process chamber 20 can be depressurized by the exhaust mechanism 24. An adjustment valve 26 configured to adjust an amount of exhaust performed by the exhaust mechanism 24 is installed in the exhaust pipe 25. For example, as illustrated in FIG. 3, gate valves 27 are installed at multiple points in a lateral surface of the process chamber 20 facing the vacuum transfer chamber 21, namely between the process chamber 20 and the vacuum transfer chamber 21. The gate valves 27 are kept closed in a normal state. By opening the gate valves 27, it becomes possible to transfer the wafers W between the vacuum transfer chamber 21 and the process chamber 20. In FIG. 3, there is illustrated a state in which the gate valves 27 are installed at three points at regular intervals. However, the arrangement and installation number of the gate valves 27 may be arbitrarily set. In FIG. 2, there is illustrated a state in which, for example, the exhaust pipe 25 is connected to the lateral surface of the process chamber 20 at one point. However, from the viewpoint of uniformly exhausting the interior of the process chamber 20 and preventing occurrence of an uneven flow, it is desirable that exhaust pipes 25 are installed in the process chamber 20 at multiple points.

A gas supply mechanism 30 configured to supply a predetermined process gas into the process chamber 20 is coupled to, for example, a ceiling surface of the process chamber 20, via a gas supply pipe 31. A flow rate adjustment mechanism 32 configured to adjust a supply amount of a process gas is installed in the gas supply pipe 31. In FIG. 2, there is illustrated a state in which, for example, the gas supply pipe 31 is connected to the ceiling surface of the process chamber 20 at one point. However, from the viewpoint of uniformly supplying the process gas into the process chamber 20 and uniformly performing a wafer process, it is desirable that, similar to the case of the exhaust pipes 25, gas supply pipes 31 are installed in the process chamber 20 at multiple points. Furthermore, the connection point of the gas supply pipe 31 is not limited to the ceiling surface of the process chamber 20 but may be the lateral surface of the process chamber 20 or the like. In particular, there may be a case where a plasma source configured to introduce plasma for assisting a film-forming process on the wafers W into the process chamber 20 is disposed on the top surface or the lateral surface of the process chamber 20. Accordingly, the arrangement of devices at the outer side of the process chamber 20 may be arbitrarily set depending on the contents of the process performed by the wafer processing system 1.

For example, as illustrated in FIG. 2, the load lock chambers 5 are disposed under the process chamber 20. In other words, the load lock chambers 5 are disposed across the lower side of the process chamber 20 in a plane view The load lock chambers 5 interconnect the vacuum transfer chamber 21 and the transfer chamber 11. Gate valves (not shown) are installed between the load lock chambers 5 and the transfer chamber 11 and between the load lock chambers 5 and the vacuum transfer chamber 21. By opening the gate valves during the transfer of the wafers W, it is possible for the wafers W to pass through the respective load lock chambers 5.

Figure 4:
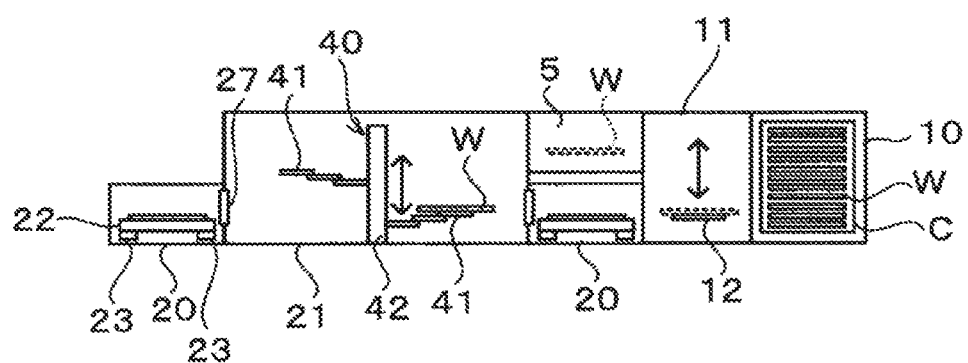
FIG. 4 is a vertical sectional view illustrating a schematic configuration of a wafer processing system according to another embodiment.

An upper portion of the vacuum transfer chamber 21 is connected to the process chamber 20 through the gate valves 27 and a lower portion of the vacuum transfer chamber 21 is connected to the load lock chambers 5 through the gate valves (not shown). Thus, the vacuum transfer chamber 21 extends downward from, for example, the bottom surface of the process chamber 20. The bottom surface of the vacuum transfer chamber 21 is substantially flush with the bottom surfaces of the load lock chambers 5. In FIG. 2, there is illustrated a state in which the load lock chambers 5 are installed under the process chamber 20. However, for example, as illustrated in FIG. 4, the load lock chambers 5 may be installed above the process chamber 20. In other words, the load lock chambers S may be disposed across the upper side of the process chamber 20 in a plane view.

Similar to the process chamber 20 an exhaust mechanism (not shown) is connected to the vacuum transfer chamber 21. The interior of the vacuum transfer chamber 21 can be depressurized by the exhaust mechanism. A wafer transfer mechanism 40 configured to transfer the wafers W between the load lock chambers S and the process chamber 20 is installed within the vacuum transfer chamber 21.

The wafer transfer mechanism 40 includes a plurality of swingable and extendible articulated transfer arms 41. The respective transfer arms 41 are supported by a support member 42 installed, for example, in the central portion of the vacuum transfer chamber 21 to extend in the vertical direction. Furthermore, the respective transfer arms 41 are configured so that they can be moved up and down along the support member 42 by an elevator mechanism (not shown). The respective transfer arms 41 can transfer the wafers W between the load lock chambers 5 and the process chamber 20. In FIG. 1, there is illustrated a state in which, for example, three transfer arms 41 are installed. However, the installation number of the transfer arms 41 may be arbitrarily set. The configuration of the wafer transfer mechanism 40 is not limited to that of this embodiment. A structure and type of the wafer transfer mechanism 40 may be arbitrarily set as long as the wafer transfer mechanism 40 can transfer the wafers W between the load lock chambers S and the process chamber 20.

The control device 4 is, for example, a computer, and includes a program storage part (not shown). A program for controlling the process of the wafers W in the wafer processing system 1 is stored in the program storage part. This program is recorded in a computer-readable recording medium such as, e.g., a hard disk (HD), a flexible disk (FD), a compact disk (CD), a magneto-optical disk (MO) or a memory card, and may be installed in the control device 4 from the recording medium.

The wafer processing system 1 according to this embodiment is configured as above. Next, descriptions will be made on the wafer process performed by the wafer processing system 1.

When processing the wafers W, a plurality of unprocessed wafers W is first taken out from the respective cassette C of the cassette station 2 by the wafer transfer arm 12 and is sequentially transferred into the respective load lock chamber 5. Thereafter, the interior of the load lock chamber 5 is exhausted and depressurized to a predetermined pressure.

Subsequently, the gate valves (not shown) existing between the load lock chamber 5 and the vacuum transfer chamber 21 whose interior is kept in a depressurized state in advance, are opened and the wafers W existing within the load lock chamber 5 are sequentially loaded into the process chamber 20 which is kept in a depressurized state in advance, via the vacuum transfer chamber 21 by the transfer arms 41 of the wafer transfer mechanism 40.

The wafers W transferred into the process chamber 20 are sequentially mounted on the mounting table 22 by way of the lift pins (not shown).

Figure 5:
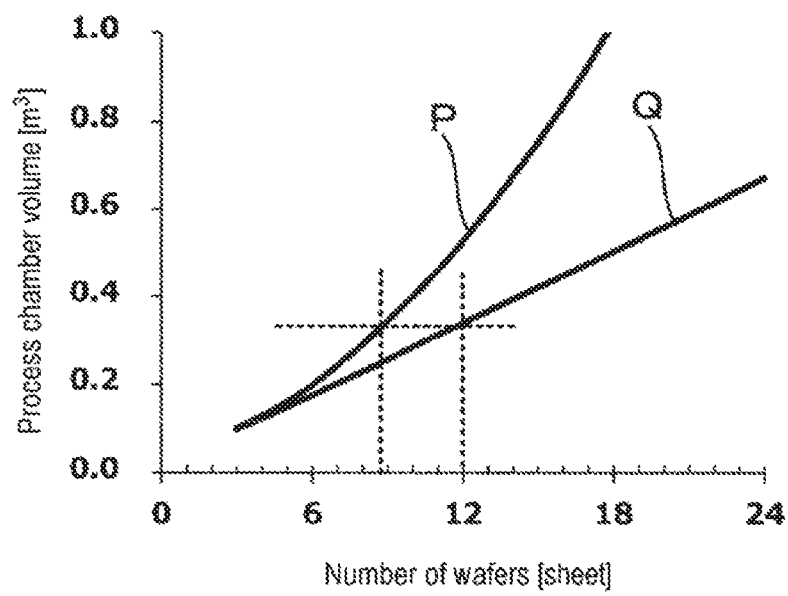
FIG. 5 is a graph illustrating the relationship between the number of wafers to be processed in a process chamber and the volume of the process chamber.
Figure 13:
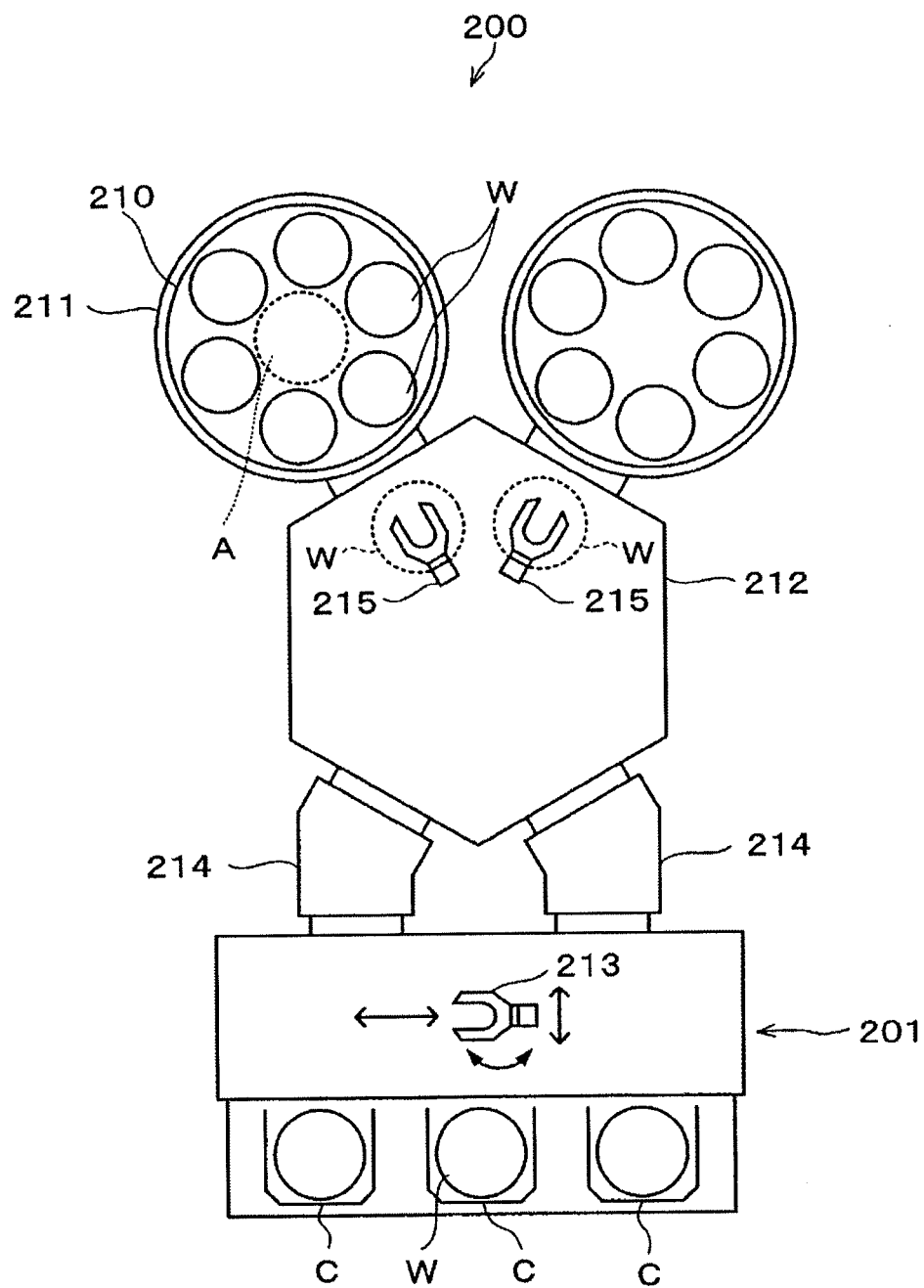
FIG. 13 is a plane view illustrating a schematic configuration of a conventional batch processing system.

If all the wafers W are loaded into the process chamber 20, the gate valves 27 are closed and the process of the wafers W is implemented by the control device 4. When processing the waters W, the interior of the process chamber 20 is depressurized to a predetermined pressure by the exhaust mechanism 24. At this time, the exhaust process is rapidly performed because the process chamber 20 is formed in an annular shape, in the conventional cylindrical process chamber 211, it is necessary to perform an exhaust process with respect to the space A illustrated in FIG. 13. The space A increases in proportion to the increase in the number of the wafers W disposed within the process chamber 211. Since the diameter of the space A increases along with the increase in the number of the wafers W, the volume of the process chamber 211 required in processing one wafer W ("required processing volume") gradually increases in proportion to the square of the radius of the space A. For that reason, the volume of the process chamber 211 does not linearly increases but progressively increases, for example, as indicated by a line P in FIG. 5. Accordingly, there is posed a problem in that the time required in exhausting the interior of the process chamber 211 increases along with the increase in the number of the wafers W. The horizontal axis in FIG. 5 indicates the installation number of the wafers W and the vertical axis indicates the internal volume of the process chamber. In addition, FIG. 5 is directed to a case where the diameter of each of the wafers W is 300 mm.

Figure 6:
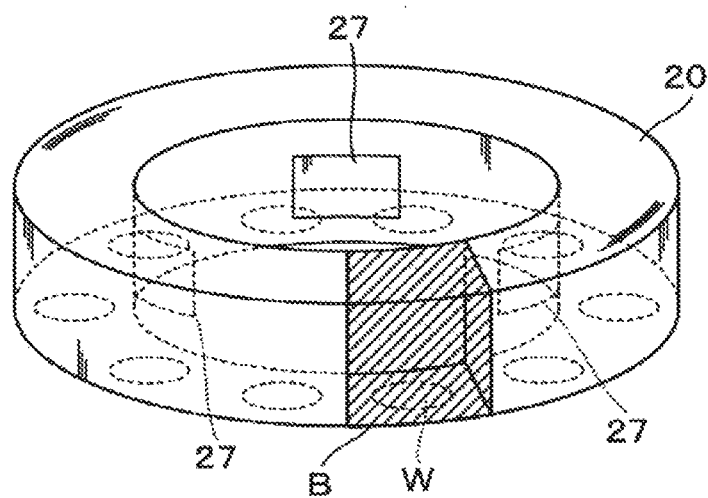
FIG. 6 is an explanatory view on a required processing volume of the process chamber.

On the other hand, in the process chamber 20 of this embodiment, when increasing the number of the wafers W disposed within the process chamber 20, it is only necessary to enlarge the diameter R of the process chamber 20 illustrated in FIG. 2 while keeping the width S of the process chamber 20 constant. In other words, even if the number of the wafers W disposed within the process chamber 20 is increased, the required processing volume in the process chamber 20, for example, the volume of the space B hatched in FIG. 6, is kept constant. Thus, for example, when increasing the number of the wafers W by one, it is only necessary to increase the volume of the process chamber 20 just as much as the space B corresponding to one wafer. There is not generated a phenomenon that, as is the case in the conventional process chamber 211, the volume of the process chamber 211 increases along with the change in the diameter of the space A. As a result, the volume of the process chamber 20 linearly increases along with the increase in the number of the wafers W as indicated by a line Q in FIG. 5. Accordingly, even if the number of the wafers W disposed within the process chamber 20 is increased, it is possible to significantly shorten the exhaust time as compared with the conventional process chamber 211. More specifically, for example, as illustrated in FIG. 5, when a process chamber 20 capable of accommodating twelve wafers W is provided, it is possible for the conventional process chamber 211 to accommodate only eight wafers W in the same volume. Thus, the exhaust time required per one wafer becomes longer.

If the interior of the process chamber 20 is depressurized to a predetermined pressure, a specified process gas is supplied from the gas supply mechanism 30, whereby a film-forming process is performed with respect to the wafers W Since the required processing volume of the process chamber 20 of this embodiment is smaller than that of the conventional process chamber 211 as described above, it is possible to reduce a flow rate of the process gas supplied to process one wafer W. It is also possible to reduce the running cost of the wafer processing system 1. If the film-forming process performed within the process chamber 20 is completed, the gate valves 27 are opened. Subsequently, the processed wafers W are sequentially unloaded from the process chamber 20 into the vacuum transfer chamber 21 by the transfer arms 41 of the wafer transfer mechanism 40. Thereafter, the wafers W are sequentially accommodated within the respective cassette C of the cassette station 2 via the respective load lock chamber 5. If all the wafers W are accommodated within the respectively cassette C, the respective cassette C is transferred outside the cassette station 2. A new cassette C accommodating unprocessed wafers W is transferred to the cassette station 2. Then, the unprocessed wafers W are sequentially transferred to the process chamber 20 so that a series of processes described above are repeated.

According to the above embodiments, the process chamber 20 is formed in an annular shape and the wafers W are concentrically disposed within the process chamber 20. Thus, there is no phenomenon that, as is the case in the conventional cylindrical process chamber 211, the space A gradually increases along with the increase in the number of the wafers W accommodated. Accordingly, even if the number of the waters W processed in the process chamber 20 is increased, it is possible to suppress the increase in the volume of the process chamber 20 to a minimum level.

Furthermore, in the conventional batch processing system 200, if the installation number of the process chambers 211 is increased, the vacuum transfer chamber 21 installed outside the process chambers 211 needs to be enlarged along with the increase in the number of the transfer arms 215. For that reason, the footprint increases not only due to the increase in the number of the process chambers 211 but also due to the enlargement of the vacuum transfer chamber 212.

In contrast, in this embodiment, the vacuum transfer chamber 21 is installed in the space defined inside the annular process chamber 20. The increase in the footprint of the wafer processing system 1 can be suppressed to only the increase in the size of the process chamber 20. That is to say, the increase in the footprint with respect to the process number of the wafers W in the wafer processing system 1 of this embodiment becomes substantially linear if there is no change in the size of the cassette station 2 or the load lock chambers 5 which is the transfer system installed outside the vacuum transfer chamber 21. Thus, according to this embodiment, it is possible to increase the process number of the wafers W per the same footprint as compared with the related art.

Figure 7:
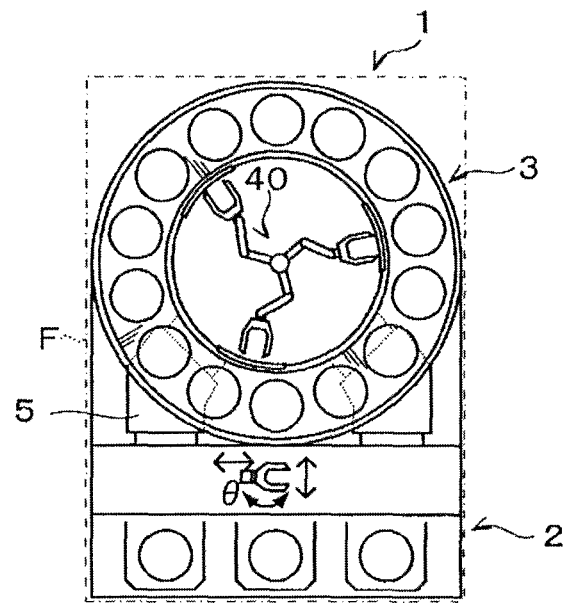
FIG. 7 is an explanatory view illustrating a footprint of the wafer processing system.
Figure 8:
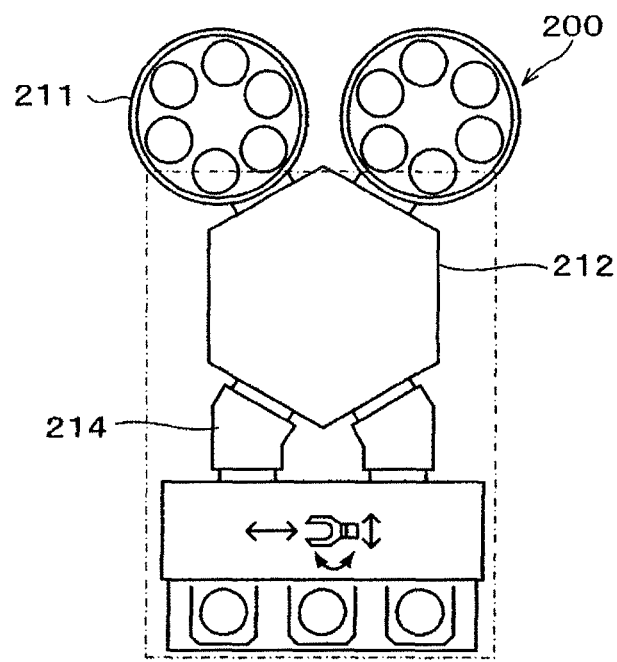
FIG. 8 is an explanatory view illustrating a footprint of a conventional batch processing system.

Furthermore, in the conventional batch processing system 200 and the wafer processing system 1 according to this embodiment if it is assumed that the configurations of the cassette stations 2 and 201 or the configurations of the load lock chambers 5 and 214 are substantially identical with each other, the footprint F (indicated by a dashed line in FIG. 7) of the wafer processing system 1 of this embodiment illustrated in FIG. 7 falls within such a region that substantially covers the cassette station 201, the load lock chambers 214 and the vacuum transfer chamber 212 of the conventional batch processing system 200, for example, as illustrated in FIG. 8. According to the study of the present inventors, it was confirmed that, for example, when twelve wafers W are processed in a batch manner by the wafer processing system 1, the footprint of the wafer processing system 1 according to this embodiment can be reduced by about 30% as compared with the footprint of the conventional batch processing system 200.

Furthermore, in the wafer processing system I according to this embodiment, the load lock chambers 5 are installed across the upper side or the lower side of the process chamber 20. It is therefore possible to reduce the footprint even in the area where the load lock chambers 5 and the process chamber 20 overlap with each other in a plane view.

While in the above embodiments, the vacuum transfer chamber 21 has been described to be disposed inside the annular process chamber 20, the vacuum transfer chamber 21 need not be necessarily installed inside the process chamber 20, because it is only necessary to form the process chamber 20 in an annular shape from the viewpoint of not increasing the required processing volume of the process chamber 20. In this case, the gate valves 27 may be installed outside the process chamber 20.

In the case where the vacuum transfer chamber 21 is installed inside the process chamber 20, the transfer arms 41 can gain access to the gate valves 27 even if the gate valves 27 are installed at any position inside the process chamber 20. In other words, if the vacuum transfer chamber 21 is installed inside the process chamber 20, it is possible to freely set the positions of the gate valves 27. Accordingly, it is preferable to install the vacuum transfer chamber 21 inside the process chamber 20. In particular, by disposing the wafer transfer mechanism 40 at the center of the vacuum transfer chamber 21, the distances from the respective transfer arms 41 to the process chamber 20 become equal to one another. Thus, the transfer delay due to the difference in the transfer distance does not occur. It is therefore easy to manage the transfer time of the wafers W. In addition, the number of the wafers W transferred per unit time can he increased as the installation number of the transfer arms 41 increases.

Figure 9:
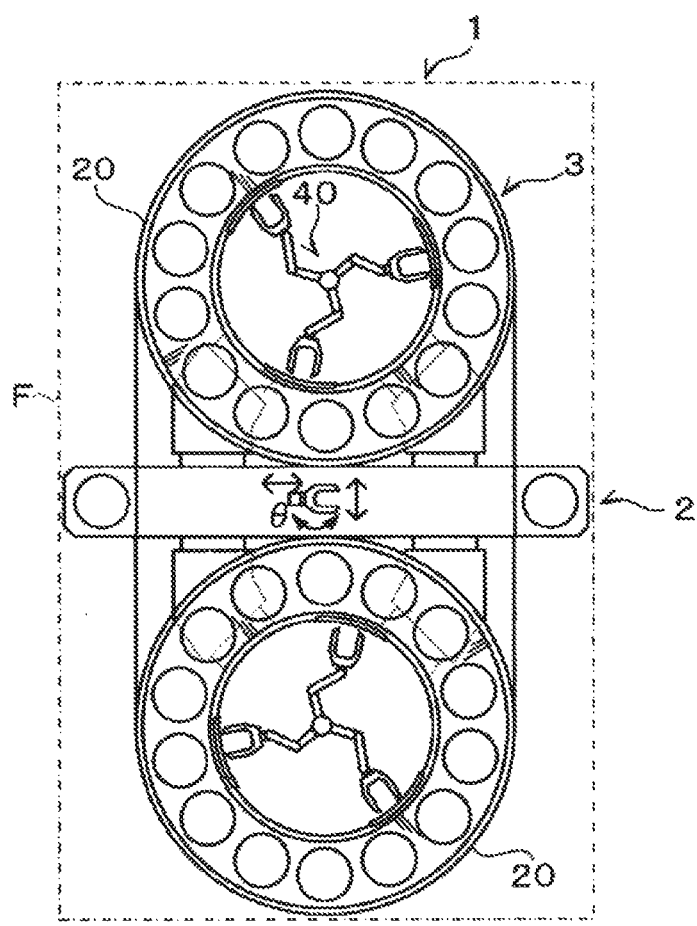
FIG. 9 is a plane view illustrating a schematic configuration of a wafer processing system according to yet another embodiment.

While in the above embodiments, the water processing system 1 has been described to include the single process chamber 20, a plurality of process chambers 20 may be installed in the wafer processing system 1. For example, when two process chambers 20 are installed, as illustrated in FIG. 9, the two process chambers 20 may be installed so as to interpose the cassette station 2 between the two process chambers 20, namely at the opposite sides of the cassette station 2. By doing so, it is possible to suppress the increase in the footprint to a minimum level. In FIG. 9, the transfer chamber 11 is installed common to the two process chambers 20 and the cassette station 2 is configured so that the cassettes C are disposed at the lateral sides of the transfer chamber 11. Other configurations are the same as the configurations described above.

Figure 10:
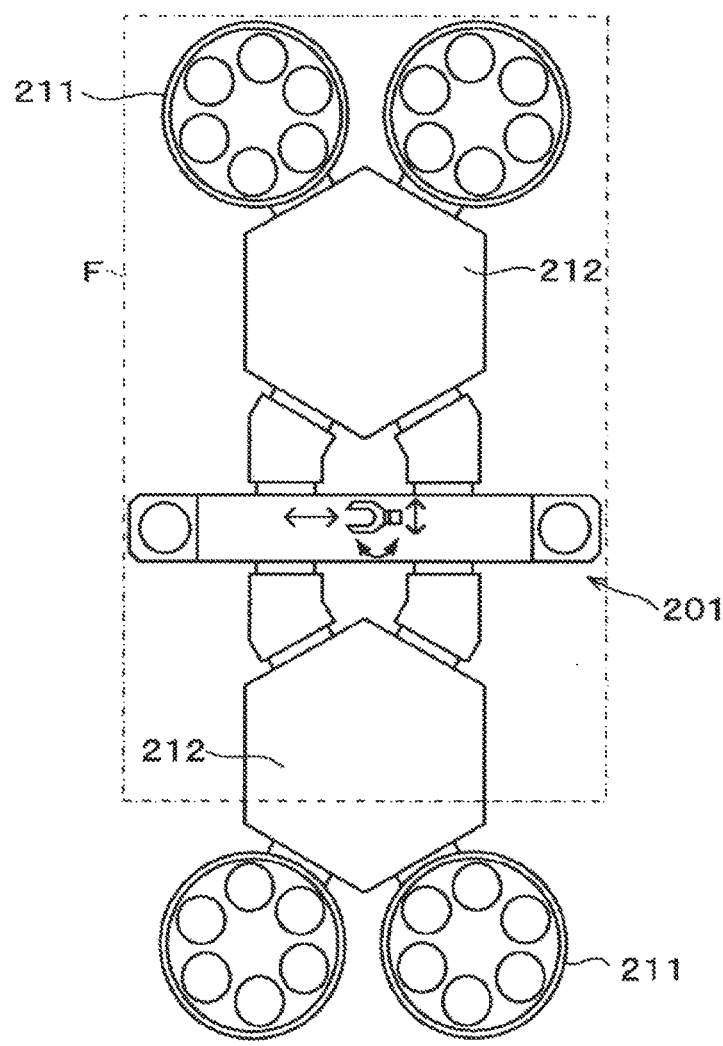
FIG. 10 is a plane view illustrating a schematic configuration of a conventional batch processing system.

On the other hand, if the process chambers 211 are disposed at the opposite sides of the cassette station 2 in the conventional batch processing system 200, the footprint is significantly increased. As an example, FIG. 10 illustrates the conventional batch processing system 200 in which the process chambers 211 are disposed at the opposite sides of the cassette station 2. The region indicated by a dashed line in FIG. 10 is the footprint F of the wafer processing system 1 illustrated in FIG. 9, In this way, by using the process chamber 20 according to this embodiment, it is possible to suppress the increase in the footprint attributable to the increase in the processing number of the wafers W to a minimum level.

Figure 11:
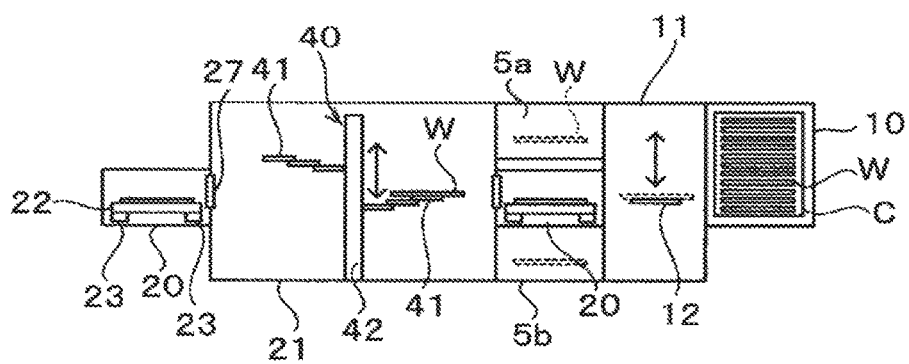
FIG. 11 is a vertical sectional view illustrating a schematic configuration of a wafer processing system according to a still further embodiment.
Figure 12:
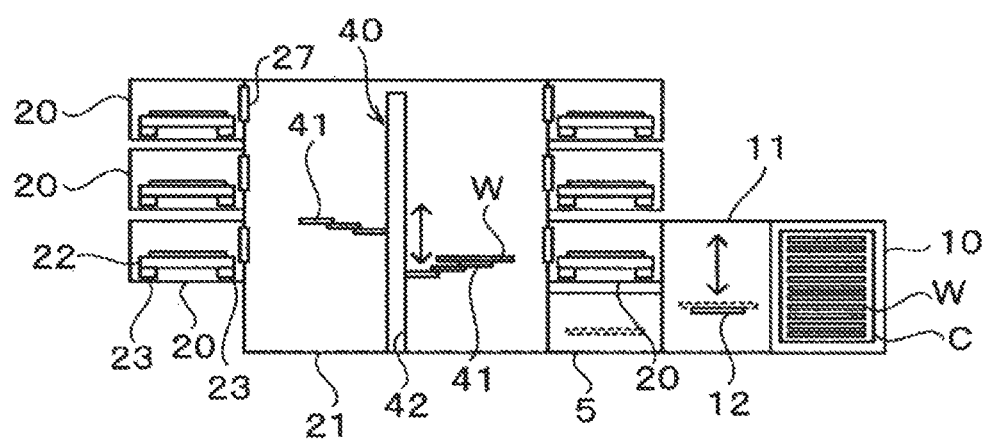
FIG. 12 is a vertical sectional view illustrating a schematic configuration of a wafer processing system according to a yet still further embodiment.

While in the above embodiments, the load lock chambers 5 have been described to be disposed at one of the upper and lower side of the process chamber 20, the present disclosure is not limited thereto. In some embodiments, as illustrated in FIG. 11, two load lock chambers 5a and 5b may be disposed at the upper and lower side of the process chamber 20 so as to extend across the upper and lower side of the process chamber 20. In this case, the vacuum transfer chamber 21 may be installed at a height where the wafers W can be transferred to both the load lock chambers 5a and 5b. In general, it is sometimes the case that the transfer speed between the vacuum transfer chamber 21 and the cassette C is limited in the load lock chamber 5. By disposing the load lock chambers 5a and 5b at multiple stages in the up-down direction as illustrated in FIG. 11, it is possible to eliminate the load lock chambers from becoming a bottleneck.

While FIG. 11 illustrates a case where the load lock chambers 5 are installed at multiple stages, the process chambers 20 may also be disposed at multiple stages in the up-down direction, for example, as illustrated in FIG. 11 Even in such a case, the vacuum transfer chamber 21 may be installed at a height corresponding to the number of stages of the process chambers 20 installed in the up-down direction In this way, by installing the process chambers 20 at multiple stages in the up-down direction, it is possible to improve throughput of the process of the waters W in the wafer processing system 1 without increasing the footprint of the wafer processing system 1.

While in the above embodiments, there has been described, by way of example, a case where the batch process of collectively processing the plurality of wafers W within the process chamber 20 is performed, the application of the process chamber according to this embodiment is not limited to such a batch process. As an example, the present disclosure may be applied to a single-wafer-type wafer processing system in which the interior of the process chamber 20 is partitioned for each space B illustrated in FIG. 6 and the process of the wafers W is individually performed in each space B. Furthermore, the present disclosure may be applied to a wafer processing system in which two or more wafers W are simultaneously processed in a space formed by interconnecting two or more spaces B, namely a wafer processing system in which, for example, a plurality of adjoining spaces B is interconnected and defined into a single space and in which a plurality of wafers W is simultaneously processed in the space thus defined.

While the preferred embodiment of the present disclosure has been described with reference to the accompanying drawings, the present disclosure is not limited to the aforementioned embodiment. It is clear that a person having an ordinary knowledge in the relevant art will be able to conceive various kinds of changes and modifications within the spirit of the present disclosure defined in the claims. It is to be understood that these changes and modifications may well fall within the scope of the technical scope of the present disclosure. The present disclosure is not limited to the aforementioned embodiment but may employ different forms. In addition, the present disclosure may be applied not only to a film-forming process performed in a processing apparatus but also other processes, for example, an etching process.

EXPLANATION OF REFERENCE NUMERALS

1: wafer processing system, 2: cassette station, 3: processing station, 4: control device, 5: load lock chamber, 10: cassette mounting part, 11: transfer chamber, 12: wafer transfer arm, 20: process chamber, 21: vacuum transfer chamber, 22: mounting table, 23: drive mechanism, 24: exhaust mechanism, 27: gate valve, 30: gas supply mechanism, 40: wafer transfer mechanism, C: cassette

What is claimed is:

1. A substrate processing system for performing a process with respect to a plurality of substrates, comprising:
   an annular process chamber configured to accommodate the plurality of substrates and to perform a predetermined process on the plurality of substrates, the annular process chamber having an inner lateral surface and an outer lateral surface;
   a cassette mounting part configured to mount a cassette which accommodates the plurality of substrates;
   a substrate transfer mechanism configured to transfer the plurality of substrates between the annular process chamber and the cassette mounting part; and
   a gate valve is installed in the inner lateral surface of the annular process chamber facing the substrate transfer mechanism,
   wherein the plurality of substrates is concentrically disposed within the annular process chamber in a plane view,
   wherein the substrate transfer mechanism is disposed in a space surrounded by the inner lateral surface of the annular process chamber, and
   wherein a vacuum transfer chamber is installed adjacent to the annular process chamber in the space surrounded by the inner lateral surface of the annular process chamber, and the substrate transfer mechanism is disposed within the vacuum transfer chamber.

2. The system of claim 1, wherein the vacuum transfer chamber and the cassette mounting part are connected to each other via a load lock chamber.

3. The system of claim 2, wherein the load lock chamber is disposed at an upper side of the annular process chamber, at the lower side of the process chamber, or at both the upper and lower sides of the annular process chamber.

4. The system of claim 3, wherein an annular mounting table configured to mount the plurality of substrates thereon is installed within the annular process chamber.

5. The system of claim 2, wherein an annular mounting table configured to mount the plurality of substrates thereon is installed within the annular process chamber.

6. The system of claim 1, wherein an annular mounting table configured to mount the plurality of substrates thereon is installed within the annular process chamber.

* * * * *